(12) United States Patent
Fan et al.

(10) Patent No.: US 11,092,888 B2
(45) Date of Patent: Aug. 17, 2021

(54) PROCESSING METHOD FOR MULTI-ROW, MULTI-COLUMN FLAT LENS WITH EQUIVALENT NEGATIVE REFRACTIVE INDEX

(71) Applicant: ANHUI DONGCHAO SCIENCE AND TECH COMPANY LIMITED, Hefei (CN)

(72) Inventors: Chao Fan, Hefei (CN); Dongcheng Han, Hefei (CN); Liangliang Zhang, Hefei (CN)

(73) Assignee: ANHUI DONGCHAO SCIENCE AND TECH COMPANY LIMITED, Hefei (CN)

( * ) Notice: Subject to any disclaimer, the term of this patent is extended or adjusted under 35 U.S.C. 154(b) by 0 days.

(21) Appl. No.: 17/142,584

(22) Filed: Jan. 6, 2021

(65) Prior Publication Data

US 2021/0157231 A1    May 27, 2021

Related U.S. Application Data

(63) Continuation of application No. PCT/CN2018/095949, filed on Jul. 17, 2018.

(30) Foreign Application Priority Data

Jul. 12, 2018    (CN) .......................... 201810760383.0

(51) Int. Cl.
*G03F 7/20* (2006.01)
*G02B 1/00* (2006.01)
(Continued)

(52) U.S. Cl.
CPC ......... *G03F 7/0007* (2013.01); *G02B 3/0056* (2013.01); *G03F 7/0005* (2013.01);
(Continued)

(58) Field of Classification Search
CPC ..... G03F 7/0005; G03F 7/2002; G02B 1/007; G02B 3/0056; G02B 5/136; G02B 30/26; G02B 30/56
See application file for complete search history.

(56) References Cited

U.S. PATENT DOCUMENTS

2005/0200960 A1    9/2005 Tang
2009/0040132 A1*   2/2009 Sridhar .............. H01Q 15/0086
                                                      343/911 R
(Continued)

FOREIGN PATENT DOCUMENTS

CN            1997929 A      7/2007
CN          203013727 U      6/2013
(Continued)

OTHER PUBLICATIONS

Ghoshroy, Anindya, et al. "Active plasmon injection scheme for subdiffraction imaging with imperfect negative index flat lens." JOSA B 34.7 (2017): 1478-1488.

*Primary Examiner* — John A McPherson
(74) *Attorney, Agent, or Firm* — IPRO, PLLC

(57) ABSTRACT

Provided is a processing method for a multi-row, multi-column flat lens with an equivalent negative refractive index, which includes: performing photoresist coating, masking and exposure on the photolithography surface; removing photoresist in an unexposed block, and forming a rectangular groove; coating a surface of an exposed block and all surfaces of the rectangular groove with a protective layer, and then coating a side surface of the rectangular groove with a reflective film; removing the protective layer on the surface of the exposed block and the bottom surface of the rectangular groove, then filling up the groove with a filling material, and further processing the front and rear surfaces of the parallel plate in such a manner that a parallel misalignment between the front and rear surfaces thereof is (Continued)

smaller than 1'; and adding a protective window sheet on each of the front and rear surfaces of the new parallel plate.

6 Claims, 4 Drawing Sheets

(51) Int. Cl.
  *G03F 7/00* (2006.01)
  *G02B 3/00* (2006.01)
  *G02B 30/56* (2020.01)

(52) U.S. Cl.
  CPC .............. *G02B 1/007* (2013.01); *G02B 30/56* (2020.01); *G03F 7/2002* (2013.01)

(56) References Cited

U.S. PATENT DOCUMENTS

| | | | |
|---|---|---|---|
| 2009/0147379 A1* | 6/2009 | Li | H01L 31/02327 359/741 |
| 2009/0310231 A1* | 12/2009 | Maekawa | G02B 17/006 359/733 |
| 2010/0165482 A1* | 7/2010 | Liu | G02B 1/005 359/708 |
| 2012/0156594 A1* | 6/2012 | Lee | G03F 1/50 430/5 |
| 2017/0276953 A1 | 9/2017 | Huang | |
| 2019/0074595 A1* | 3/2019 | Suzuki | H01Q 15/0086 |
| 2021/0018658 A1* | 1/2021 | Fan | B29D 11/00721 |

FOREIGN PATENT DOCUMENTS

| | | |
|---|---|---|
| CN | 103713392 A | 4/2014 |
| CN | 106597583 A | 4/2017 |
| CN | 107831558 A | 3/2018 |
| CN | 107850701 A | 3/2018 |
| CN | 108139507 A | 6/2018 |
| WO | 2015138362 A1 | 9/2015 |

* cited by examiner 4-1    4-2

5-1    5-2 ced optical waveguides and
achieve the purpose of sharp three-dimensional imaging of
a spliced array. The technical solutions of the present
disclosure will be described as follows:

The processing method for the multi-row, multi-column
flat lens with the equivalent negative refractive index
includes:

step 1: processing an optical material into a rectangular
block, cutting the rectangular block into a square plate, and
processing the square plate into a parallel plate having a
front surface and a rear surface that are parallel to each
other;

step 2: taking one of the front surface and the rear surface
of the parallel plate as a photolithography surface, and
successively performing photoresist coating, masking and
exposure on the photolithography surface, wherein unexposed blocks and exposed blocks subjected to the exposure
are rectangular blocks, diagonal sides of all the rectangular
blocks are respectively parallel to edges of the parallel plate,
and the exposed blocks and the unexposed blocks are
diagonally interlaced;

step 3: removing photoresist in the unexposed blocks on
the parallel plate, and forming rectangular grooves each
having a depth ranging from 0.1 mm to 2 mm;

step 4: coating surfaces of the exposed blocks and all
surfaces of the rectangular grooves with a protective layer,
and coating side surfaces of the rectangular grooves with a
reflective film;

step 5: removing the protective layer on the surfaces of the
exposed block and bottom surfaces of the rectangular
grooves, filling the rectangular grooves with a filling material, and further processing the front surface and the rear
surface of the parallel plate in such a manner that a parallel
misalignment between the front surface and the rear surface
thereof is smaller than 1' to obtain a new parallel plate; and step 6: adding a protective window sheet on each of the
front surface and the rear surface of the new parallel plate.

Further, each of the exposed blocks and the unexposed
blocks in the step 2 having a size satisfying 0.01 mm<a
length/a width<2 mm.

Further, the protective layer in the step 4 is resin or
photoresist.

Further, the reflective film in the step 4 is an aluminum
film.

Further, the filling material in the step 5 is resin or optical
glass.

Further, the new parallel plate and the protective window
sheet in the step 6 are glued together by using a photosensitive adhesive or a heat-sensitive adhesive.

The present disclosure has beneficial effects as follows.
The present disclosure may greatly reduce the individual
differences among the traditionally processed strip-shaped
optical waveguides. The present disclosure adopts a photolithography method to process each unit, in such a manner
that each unit is uniformly processed in size, an error is
small, and an assembly error of a system is avoided. The
processing size of imaging each imaging unit of the flat lens
may be reduced to an order of microns, and an imaging
resolution of the flat lens may be greatly improved. Meanwhile, due to the extremely small system processing error,
the requirements for the extremely small imaging distortion,
three-dimensional display characteristics and the naked eye
three-dimensional holographic display can be met, and the
sharp three-dimensional imaging of the spliced array can be
truly achieved.

PROCESSING METHOD FOR MULTI-ROW, MULTI-COLUMN FLAT LENS WITH EQUIVALENT NEGATIVE REFRACTIVE INDEX

CROSS-REFERENCE TO RELATED APPLICATIONS

The present application is a continuation of International Application No. PCT/CN2018/095949, filed on Jul. 17, 2018, which claims a priority to Chinese Patent Application No. 201810760383.0, filed on Jul. 12, 2018, both of which are hereby incorporated by reference in their entireties.

TECHNICAL FIELD

The present disclosure relates to the field of optical manufacturing, and more particularly, to a processing method for a multi-row, multi-column flat lens with an equivalent negative refractive index, aiming to achieve imaging in the air.

BACKGROUND

With the development of imaging display technology, requirements for imaging characteristics are continuously increasing. On one hand, a higher resolution is required, and it is also necessary to meet a requirement for a small distortion while ensuring the sharpness of an observed picture. On the other hand, three-dimensional display characteristics are required, meanwhile the naked-eye three-dimensional holographic display is also required. As a main current imaging technology, lens imaging is mainly limited by a field of view and an aperture, has optical aberrations such as spherical aberrations, coma aberrations, astigmatism, field curvature, distortion, chromatic aberration and the like, and thus has a great limitation in the field of large-field and large-aperture imaging display. Moreover, most of the current naked eye three-dimensional display technologies achieve the three-dimensional sense by adjusting parallax between left and right eyes, and thus do not belong to the actual three-dimensional display technologies. However, the holographic imaging technology has high production costs.

In order to pursue a better display effect and a better product experience, the present disclosure provides a processing technology for an equivalent negative refractive flat lens capable of achieving three-dimensional imaging display, thereby providing technological support for an equivalent negative refractive flat lens which achieves the naked eye three-dimensional display. The strip-shaped optical waveguides manufactured by the existing optical waveguide processing technology greatly differ from each other in: cross-sectional dimensions having different deviations, which results in that a parallel misalignment of each surface is inconsistent, so that after cutting, rows and columns of the spliced multi-row, multi-column flat lens with an equivalent negative refractive index for three-dimensional imaging are irregularly arranged, and directions of deflection of the lights in the square waveguides are not consistent, resulting in shearing of each area of the image. Thus, it is difficult to achieve three-dimensional imaging of high sharpness.

SUMMARY

For the problems in the related art, the present disclosure provides a processing method for a multi-row, multi-column flat lens with an equivalent negative refractive index, which may greatly reduce individual differences among the traditionally processed strip-shaped

It should be noted that each five-pointed star in the above drawings represents a simple image.

DESCRIPTION OF EMBODIMENTS

In the following, the present disclosure will be described in further detail with reference to the drawings and embodiments, aiming to explain, rather than limiting, the present disclosure.

Figure 1:
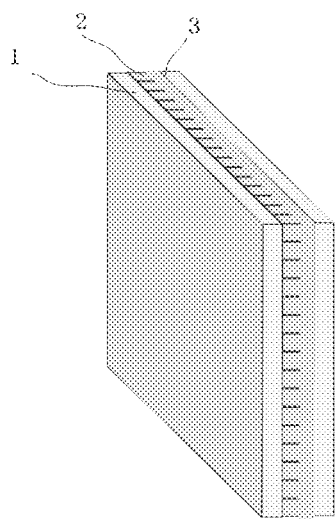
FIG. 1 is a schematic structural view of a multi-row, multi-column flat lens with an equivalent negative refractive index obtained by the present disclosure, in which 1 represents a first glass window sheet, 2 represents an optical waveguide component, and 3 represents a second glass window sheet.

FIG. 1 provides a schematic structural diagram of a multi-row, multi-column flat lens with the equivalent negative refractive index according to the present disclosure. The flat lens includes a pair of glass windows (1, 3) each having two optical surfaces, and an optical waveguide component (2) located between the two glass windows. The optical waveguide component includes a rectangular optical waveguide array consisted of multiple-row and multiple-column optical waveguides arranged obliquely at 45°, and an edge optical waveguide placed on a periphery of the rectangular optical waveguide array. Individual rectangular optical waveguides in each column and/or each row of the rectangular optical waveguide array are identical in size. Such flat lens may enable a two-dimensional or three-dimensional light source to directly generate a real image in the air and thus achieve a real holographic image. This may achieve naked eye three-dimensional display characteristics while achieving a large field of view, a large aperture, and a high resolution with no distortion and no chromatic dispersion.

Embodiment 1

The embodiment provides a processing method for a multi-row, multi-column flat lens with an equivalent negative refractive index, which includes steps as follows.

Figure 2:
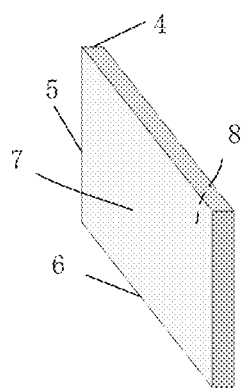
FIG. 2 is a schematic structural view of a square plate in Embodiment 1 of the present disclosure, in which 4 represents a thickness of the square plate, 5 represents a width of the square plate, 6 represents a length of the square plate, 7 represents a front surface of the square plate, and 8 represents a rear surface of the square plate.

(1) An optical material is processed into a rectangular block, which is then cut into a square plate having a structure as illustrated in FIG. 2. A size of the square plate satisfies that 10 mm<a length (6)<100 mm, 10 mm<a width (5)<100 mm, and 1 mm<a thickness (4)<6 mm, A front surface 7 and a rear surface 8 of the square plate are ground and polished in such a manner that the surfaces are parallel to each other.

Figure 3:
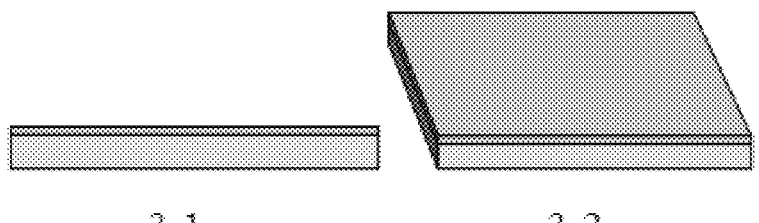
FIG. 3 is a schematic structural view of a photolithography surface of a parallel plate after photoresist coating according to Embodiment 1 of the present disclosure, in which 3-1 is a front view, and 3-2 is a stereogram.
Figure 4:
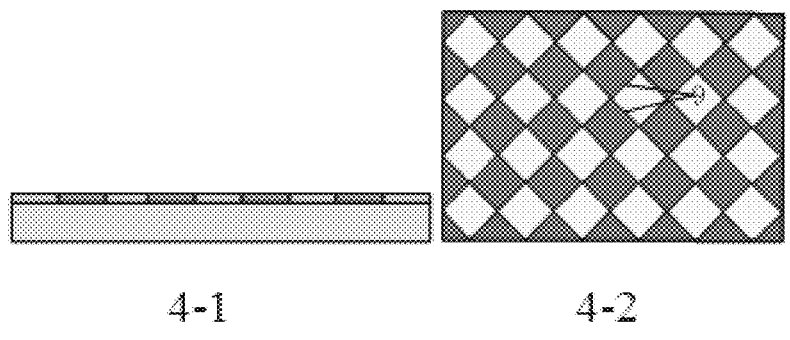
FIG. 4 is a schematic structural view of a photolithography surface of a parallel plate after masking and exposure according to Embodiment 1 of the present disclosure, in which 4-1 is a side view, 4-2 is a top view, and 9 represents sizes of an exposed block and an unexposed block.

(2) One of the front surface and the back surface of the parallel plate is used as a photolithography surface, and photoresist coating (as illustrated in FIG. 3), masking and exposure are successively performed on the photolithography surface, in which unexposed blocks and exposed blocks subjected to the exposure are rectangular and are arranged in vertical and horizontal rows and are interlaced (as illustrated in FIG. 4), and a size 9 satisfies that 0.01 mm<a length<2 mm and 0.01 mm<width<2 mm.

Figure 5:
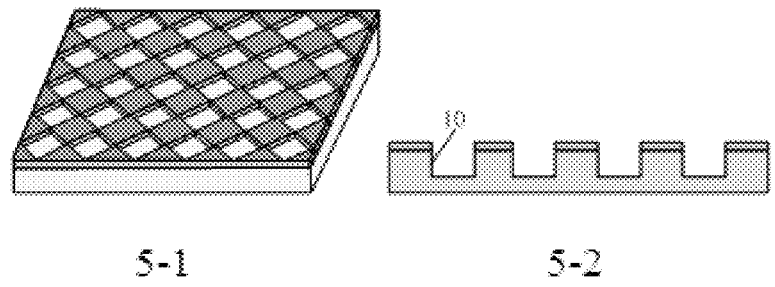
FIG. 5 is a schematic structural view of a groove on a surface of a parallel plate according to Embodiment 1 of the present disclosure, in which 5-1 is a stereogram of the parallel plate after removing photoresist from an unexposed block of the parallel plate, 5-2 is a front view of the parallel plate with a rectangular groove processed therein, and 10 is a side surface of the rectangular groove.

(3) Photoresist in the unexposed blocks on the parallel plate is removed, and a rectangular groove with a depth ranging from 0.1 mm to 2 mm is formed (as illustrated in FIG. 5).

Figure 6:
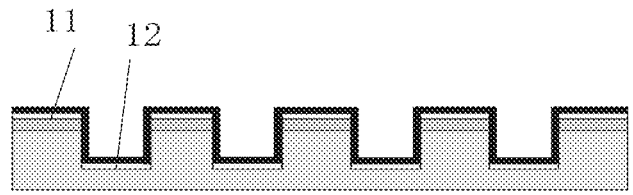
FIG. 6 is a schematic structural view of a structure of a parallel plate coated with a protective layer and a reflective film according to Embodiment 1 of the present disclosure, in which 11 represents a surface of an exposed block, and 12 represents a bottom surface of a groove.

(4) A surface of the exposed block and all surfaces of the rectangular groove are coated with a resin protective layer, and a side surface of the rectangular groove is coated with an aluminum reflective film as a total reflection surface (as illustrated in FIG. 6).

Figure 7:
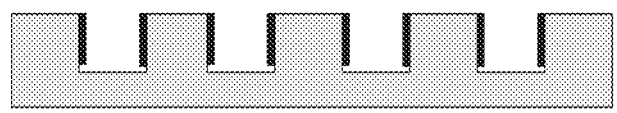
FIG. 7 is a schematic structural view of a parallel plate after removing a protective layer of the parallel plate according to Embodiment 1 of the present disclosure.
Figure 8:
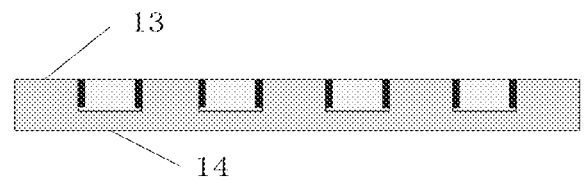
FIG. 8 is a schematic structural view of a parallel plate after a groove of the parallel plate being filled up according to Embodiment 1 of the present disclosure.
Figure 9:
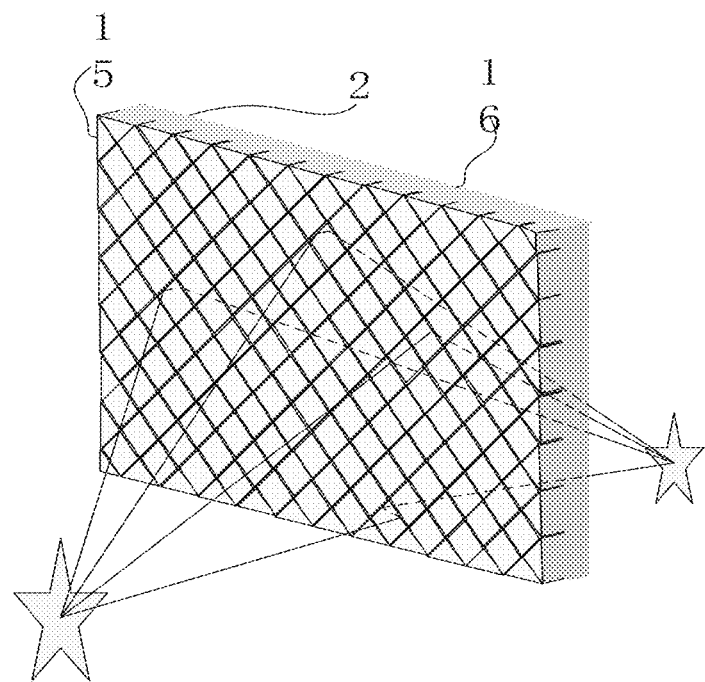
FIG. 9 is a schematic structural view of a new parallel plate according to Embodiment 1 of the present disclosure.

(5) The protective layers on the surface of the exposed block and a bottom surface of the rectangular groove are removed (as illustrated in FIG. 7), the groove is filled up with optical glass by injection molding (as illustrated in FIG. 8), and the front surface and the rear surface of the parallel plate are further processed in such a manner that a parallel misalignment of the front surface and the rear surface thereof is smaller than 1' to obtain a new parallel plate, which has a structure as illustrated in FIG. 9.

(6) A protective window sheet is added on each of the front surface and the rear surface of the new parallel plate to obtain the multi-row, multi-column flat lens with an equivalent negative refractive index as illustrated in FIG. 1. The protective window sheet and the flat lens are glued together by using a photosensitive adhesive or a heat-sensitive adhesive.

The multi-row, multi-column flat lens with an equivalent negative refractive index is disclosed by the Chinese patent with an application number of 201711305662X.

Embodiment 2

The imaging principle of the multi-row, multi-column flat lens with the equivalent negative refractive index obtained in Embodiment 1 will be explained as follows.

Figure 10:
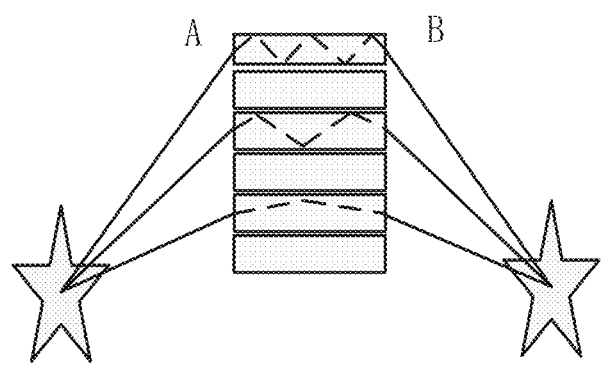
FIG. 10 is a schematic diagram illustrating reflection and focusing imaging of light rays inside an optical waveguide, in which A represents an object side and B represents an image side.
Figure 11:
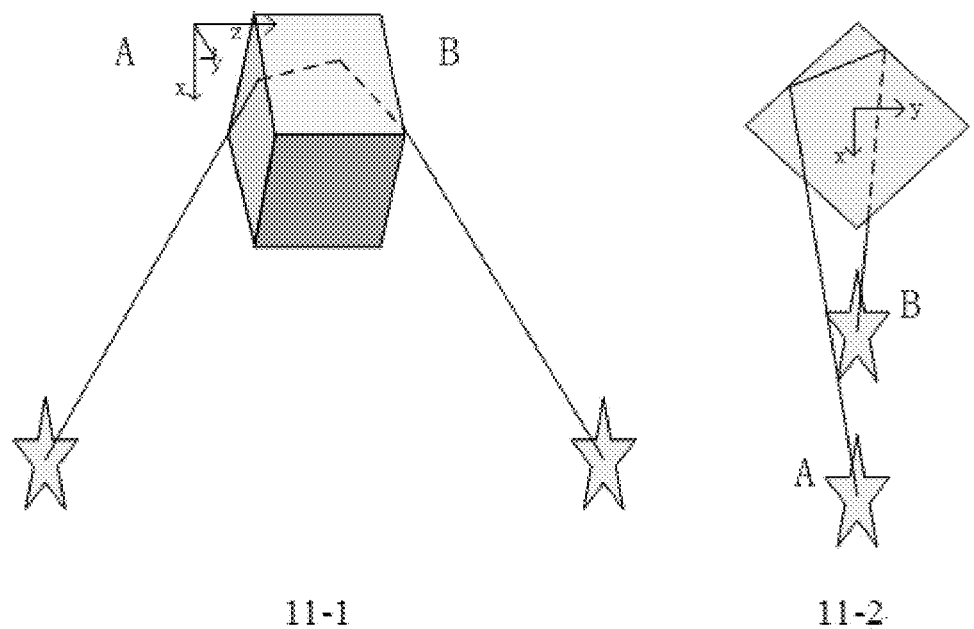
FIG. 11 is a schematic diagram illustrating a light ray from an object side being reflected inside a single microlens and propagated to an image side, in which 11-1 is a side view of a light ray propagation, and 11-2 is a left view of a light ray propagation.

The present disclosure relates to the multi-row, multi-column optical waveguide array panel with the equivalent negative refractive index, which has core imaging elements as illustrated in FIG. 9 and may achieve point-to-point aberrationless imaging between an object side and an image side. As illustrated in FIG. 10, the specific principle lies in that a light ray from an object side at side A is reflected inside optical waveguides of the equivalent negative refractive flat lens one or more times, in such a manner that the light beam is modulated into mirror light while being transmitted to an image side at side B, and then the light ray converges to an image again. As illustrated in FIG. 11, which is a schematic diagram illustrating a light ray from the object side being reflected inside a single microlens of the flat lens and modulated to the image side. A principle of the modulation lies in that when the light ray is passing through the single microlens, a component of the light ray in a right-angled plane is rotated 118°, and a component of the light ray in a vertical right-angled plane propagates along a reflection direction of the light ray, where a X\Y plane is the right-angled plane, and a X\Z plane is the vertical right-angled plane. The final imaging effect of the imaging principle is consistent with that of a flat lens made of a negative refractive material (referring to FIG. 9).

In conclusion, the present disclosure may greatly reduce individual differences among traditionally processed strip-shaped optical waveguides. The present disclosure adopts a photolithography method to process each unit, in such a manner that a size of each unit is uniformly processed with a small error, and an assembly error of a system is avoided. The processing size of each imaging unit of the flat lens may be reduced to an order of microns, and an imaging resolution of the flat lens may be greatly improved. Meanwhile, due to a fact that a system processing error is extremely small, requirements for an extremely small imaging distortion, three-dimensional display characteristics and the naked eye three-dimensional holographic display can be met, and the purpose of sharp three-dimensional imaging of the spliced array may be achieved.

Although embodiments of the present disclosure have been illustrated and described above, it will be understood that the above embodiments are exemplary and cannot be construed as limiting the present disclosure, and changes, modifications, substitutions and alternatives to the above embodiments may be made by those of ordinary skill in the art within the scope of the present disclosure.

What is claimed is:

1. A processing method for a multi-row, multi-column flat lens with an equivalent negative refractive index, comprising:
   step 1: processing an optical material into a rectangular block, cutting the rectangular block into a square plate, and processing the square plate into a parallel plate having a front surface and a rear surface that are parallel to each other;
   step 2: taking one of the front surface and the rear surface of the parallel plate as a photolithography surface, and successively performing photoresist coating, masking and exposure on the photolithography surface, wherein unexposed blocks and exposed blocks subjected to the exposure are rectangular blocks, diagonal sides of all the rectangular blocks are respectively parallel to edges of the parallel plate, and the exposed blocks and the unexposed blocks are diagonally interlaced;
   step 3: removing photoresist in the unexposed blocks on the parallel plate, and forming rectangular grooves each having a depth ranging from 0.1 mm to 2 mm;
   step 4: coating surfaces of the exposed blocks and all surfaces of the rectangular grooves with a protective layer, and coating side surfaces of the rectangular grooves with a reflective film;
   step 5: removing the protective layer on the surfaces of the exposed block and bottom surfaces of the rectangular grooves, filling the rectangular grooves with a filling material, and further processing the front surface and the rear surface of the parallel plate in such a manner that a parallel misalignment between the front surface and the rear surface thereof is smaller than 1' to obtain a new parallel plate; and
   step 6: adding a protective window sheet on each of the front surface and the rear surface of the new parallel plate.

2. The processing method of claim 1, wherein each of the exposed blocks and the unexposed blocks in the step 2 having a size satisfying 0.01 mm<a length/a width<2 mm.

3. The process method of claim 1, wherein the protective layer in the step 4 is resin or photoresist.

4. The process method of claim 1, wherein the reflective film in the step 4 is an aluminum film.

5. The process method of claim 1, wherein the filling material in the step 5 is resin or optical glass.

6. The process method of claim 1, wherein the new parallel plate and the protective window sheet in the step 6 are glued together by using a photosensitive adhesive or a heat-sensitive adhesive.

* * * * *